United States Patent
Ye (10) Patent No.: US 8,143,093 B2
(45) Date of Patent: *Mar. 27, 2012

(54) PROCESS TO MAKE METAL OXIDE THIN FILM TRANSISTOR ARRAY WITH ETCH STOPPING LAYER

(75) Inventor: Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 346 days.

This patent is subject to a terminal disclaimer.

(21) Appl. No.: 12/405,897

(22) Filed: Mar. 17, 2009

(65) Prior Publication Data
US 2009/0236597 A1    Sep. 24, 2009

Related U.S. Application Data

(60) Provisional application No. 61/038,289, filed on Mar. 20, 2008.

(51) Int. Cl.
*H01L 21/84* (2006.01)
*H01L 29/786* (2006.01)

(52) U.S. Cl. ... 438/104; 438/158; 257/43; 257/E21.411; 257/E29.296

(58) Field of Classification Search ................ 438/104, 438/158; 257/43, E21.085, E21.411, E29.296
See application file for complete search history.

(56) References Cited

U.S. PATENT DOCUMENTS

| | | | |
|---|---|---|---|
| 4,436,770 A | 3/1984 | Nishizawa et al. | |
| 4,695,432 A | 9/1987 | Colin et al. | |
| 4,769,291 A | 9/1988 | Belkind et al. | |
| 4,816,082 A | 3/1989 | Guha et al. | |
| 4,983,360 A | 1/1991 | Merdrignac et al. | |
| 5,279,679 A | 1/1994 | Murakami et al. | |
| 5,346,601 A | 9/1994 | Barada et al. | |
| 5,352,300 A | 10/1994 | Niwa et al. | |
| 5,420,452 A | 5/1995 | Tran et al. | |
| 5,522,934 A | 6/1996 | Suzuki et al. | |
| 5,571,749 A | 11/1996 | Matsuda et al. | |
| 5,620,523 A | 4/1997 | Maeda et al. | |

(Continued)

FOREIGN PATENT DOCUMENTS

CN    1588623 A    3/2005

(Continued)

OTHER PUBLICATIONS

First Office Action for Chinese Patent Application No. 200880015621.X dated Nov. 24, 2010.

(Continued)

*Primary Examiner* — Mary Wilczewski
(74) *Attorney, Agent, or Firm* — Patterson & Sheridan, L.L.P.

(57) ABSTRACT

The present invention generally relates to thin film transistors (TFTs) and methods of making TFTs. The active channel of the TFT may comprise one or more metals selected from the group consisting of zinc, gallium, tin, indium, and cadmium. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet etching the active material layer that is used for the active channel.

17 Claims, 6 Drawing Sheets

U.S. PATENT DOCUMENTS

| | | | |
|---|---|---|---|
| 5,625,199 A | 4/1997 | Baumbach et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,731,856 A | 3/1998 | Kim et al. | |
| 5,993,594 A | 11/1999 | Wicker et al. | |
| 6,150,668 A | 11/2000 | Bao et al. | |
| 6,153,013 A | 11/2000 | Sakai et al. | |
| 6,153,893 A | 11/2000 | Inoue et al. | |
| 6,159,763 A | 12/2000 | Sakai et al. | |
| 6,180,870 B1 | 1/2001 | Sano et al. | |
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,458,673 B1 | 10/2002 | Cheung | |
| 6,488,824 B1 | 12/2002 | Hollars et al. | |
| 6,566,180 B2 | 5/2003 | Park et al. | |
| 6,620,719 B1 | 9/2003 | Andry et al. | |
| 6,700,057 B2 | 3/2004 | Yasuno | |
| 6,746,959 B2 | 6/2004 | Lyu | |
| 6,787,010 B2 | 9/2004 | Cuomo et al. | |
| 6,825,134 B2 | 11/2004 | Law et al. | |
| 6,881,305 B2 | 4/2005 | Black et al. | |
| 6,890,803 B2 | 5/2005 | Lin et al. | |
| 6,943,359 B2 | 9/2005 | Vardeny et al. | |
| 6,953,947 B2 | 10/2005 | Son et al. | |
| 7,026,713 B2 | 4/2006 | Hoffman et al. | |
| 7,037,157 B2 | 5/2006 | Murakami et al. | |
| 7,145,174 B2 | 12/2006 | Chiang et al. | |
| 7,158,208 B2 | 1/2007 | De Jager et al. | |
| 7,189,992 B2 | 3/2007 | Wager, III et al. | |
| 7,235,810 B1 | 6/2007 | Yamazaki et al. | |
| 7,297,977 B2 | 11/2007 | Hoffman et al. | |
| 7,309,895 B2 | 12/2007 | Hoffman et al. | |
| 7,339,187 B2 | 3/2008 | Wager, III et al. | |
| 7,378,286 B2 | 5/2008 | Hsu et al. | |
| 7,382,421 B2 | 6/2008 | Hoffman et al. | |
| 7,601,984 B2 | 10/2009 | Sano et al. | |
| 7,626,201 B2 | 12/2009 | Chiang et al. | |
| 7,629,191 B2 | 12/2009 | Chiang et al. | |
| 7,750,440 B2 * | 7/2010 | Yagi | 257/615 |
| 7,879,698 B2 | 2/2011 | Ye | |
| 7,927,713 B2 | 4/2011 | Ye | |
| 2002/0117719 A1 | 8/2002 | Ando et al. | |
| 2002/0149053 A1 | 10/2002 | Tsunoda et al. | |
| 2003/0015234 A1 | 1/2003 | Yasuno | |
| 2003/0047785 A1 | 3/2003 | Kawasaki et al. | |
| 2003/0049464 A1 | 3/2003 | Glenn et al. | |
| 2003/0207093 A1 | 11/2003 | Tsuji et al. | |
| 2004/0018797 A1 | 1/2004 | Murakami et al. | |
| 2004/0113098 A1 | 6/2004 | Vardeny et al. | |
| 2004/0164294 A1 | 8/2004 | Son et al. | |
| 2004/0175511 A1 | 9/2004 | Hartig | |
| 2004/0235224 A1 | 11/2004 | Lin et al. | |
| 2005/0017244 A1 | 1/2005 | Hoffman et al. | |
| 2005/0028860 A1 | 2/2005 | Sano et al. | |
| 2005/0062057 A1 | 3/2005 | Yamazaki et al. | |
| 2005/0062409 A1 | 3/2005 | Yamazaki et al. | |
| 2005/0067953 A1 | 3/2005 | Yamazaki et al. | |
| 2005/0181532 A1 | 8/2005 | Patel et al. | |
| 2005/0181534 A1 | 8/2005 | Yoshimi et al. | |
| 2005/0233092 A1 | 10/2005 | Choi et al. | |
| 2005/0233595 A1 | 10/2005 | Choi et al. | |
| 2005/0251990 A1 | 11/2005 | Choi et al. | |
| 2006/0011139 A1 | 1/2006 | Sterling et al. | |
| 2006/0033106 A1 | 2/2006 | Seo et al. | |
| 2006/0038182 A1 | 2/2006 | Rogers et al. | |
| 2006/0043447 A1 | 3/2006 | Ishii et al. | |
| 2006/0046476 A1 | 3/2006 | Nakamura et al. | |
| 2006/0065299 A1 | 3/2006 | Fukawa et al. | |
| 2006/0108636 A1 | 5/2006 | Sano et al. | |
| 2006/0125098 A1 | 6/2006 | Hoffman et al. | |
| 2006/0258064 A1 | 11/2006 | Chen et al. | |
| 2006/0286725 A1 | 12/2006 | Cheng et al. | |
| 2007/0007125 A1 | 1/2007 | Krasnov et al. | |
| 2007/0026321 A1 | 2/2007 | Kumar | |
| 2007/0030569 A1 | 2/2007 | Lu et al. | |
| 2007/0057261 A1 | 3/2007 | Jeong et al. | |
| 2007/0065962 A1 | 3/2007 | Pichler | |
| 2007/0068571 A1 | 3/2007 | Li et al. | |
| 2007/0141784 A1 | 6/2007 | Wager et al. | |
| 2007/0194379 A1 | 8/2007 | Hosono et al. | |
| 2007/0252129 A1 | 11/2007 | Yagi | |
| 2007/0252147 A1 | 11/2007 | Kim et al. | |
| 2007/0252152 A1 | 11/2007 | Sato et al. | |
| 2008/0108198 A1 | 5/2008 | Wager et al. | |
| 2008/0132009 A1 | 6/2008 | Hirai | |
| 2008/0173870 A1 | 7/2008 | Kim et al. | |
| 2008/0224133 A1 | 9/2008 | Park et al. | |
| 2008/0264777 A1 * | 10/2008 | Ye | 204/192.25 |
| 2008/0272388 A1 | 11/2008 | Ushiyama et al. | |
| 2008/0308411 A1 | 12/2008 | Guo et al. | |
| 2009/0023959 A1 | 1/2009 | D'Amore et al. | |
| 2009/0026065 A1 | 1/2009 | Nukeaw et al. | |
| 2009/0045398 A1 | 2/2009 | Kato et al. | |
| 2009/0050884 A1 * | 2/2009 | Ye | 257/43 |
| 2009/0212287 A1 | 8/2009 | Nathan et al. | |
| 2009/0233424 A1 * | 9/2009 | Ye | 438/482 |
| 2009/0236597 A1 * | 9/2009 | Ye | 257/43 |
| 2009/0239335 A1 | 9/2009 | Akimoto et al. | |
| 2009/0305461 A1 | 12/2009 | Akimoto et al. | |
| 2010/0001274 A1 | 1/2010 | Ye | |
| 2010/0078633 A1 | 4/2010 | Watanabe | |
| 2010/0090215 A1 | 4/2010 | Lee | |
| 2010/0109002 A1 | 5/2010 | Itagaki et al. | |
| 2010/0117073 A1 * | 5/2010 | Yamazaki et al. | 257/43 |
| 2010/0120197 A1 | 5/2010 | Levy et al. | |
| 2010/0140611 A1 * | 6/2010 | Itagaki et al. | 257/43 |
| 2010/0193783 A1 * | 8/2010 | Yamazaki et al. | 257/43 |
| 2010/0252832 A1 * | 10/2010 | Asano et al. | 257/57 |

FOREIGN PATENT DOCUMENTS

| | | |
|---|---|---|
| EP | 145403 A2 | 6/1985 |
| JP | 02-240637 A | 9/1990 |
| JP | 06-045354 A | 2/1994 |
| JP | 3958605 | 5/2007 |
| KR | 1999009046 | 3/1999 |
| KR | 2001-0011855 A | 2/2001 |
| KR | 2001051193 | 6/2001 |
| WO | WO-2008/133345 A1 | 11/2008 |
| WO | WO 2010/002803 A2 * | 1/2010 |

OTHER PUBLICATIONS

Wang et al., "Fabrication and characteristics of the low-resistive p-type ZnO thin films by DC reactive magnetron sputtering", Materials Letters, vol. 60, p. 912-914, Dec. 31, 2006.

Wang, "The optical and electrical characteristics and the microstructure of Al doped zinc oxide thin films", Dept. of Information material science and engineering Guilin, vol. 25(02), p. 19-22, Apr. 20, 2005.

Li, "The growth of high quality ZnO thin films at low temperature by PECVD & study of its properties", Chinese doctoral dissertations & master's theses full-text database (doctor) basic sciences, Journal 2nd, A005-11, Dec. 15, 2002.

Search report and written opinion for PCT/US2009/047966 dated Dec. 27, 2010.

Search report and written opinion for PCT/US2009/049092 dated Dec. 27, 2010.

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Bian et al., "Deposition and electrical properties of N—In codoped p-type ZnO films by ultrasonic spray pyrolysis", Applied Physics Letters, vol. 84, No. 4, Jan. 26, 2004, pp. 541-543.
Barnes et al., "On the formation and stability of p-type conductivity in nitrogen-doped zinc oxide", Applied Physics Letters, 86, 112112 (2005).
Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.
Hosano et al., "Working hypothesis to explore novel wide band gap electrically conducting amorphous oxides and examples", Journal of Non-Crystalline Solids, 198-200 (1996) pp. 165-169.
Park et al., "Highly Stable $Ga_2O_3$—$In_2O_3$—ZnO Thin-Film Transistors for AM-OLED Application", IDW '07, pp. 1775-1778.
Kwon et al., "4 inch QVGA AMOLED display driven by GaInZnO TFT", IDW '07, pp. 1783-1786.
Perkins et al., "Identification of nitrogen chemical states in N-doped ZnO via x-ray photoelectron spectroscopy", Journal of Applied Physics 97, 034907 (2005).
Yao et al., "Effects of nitrogen doping and illumination on lattice constants and conductivity behavior of zinc oxide grown by magnetron sputtering", Journal of Applied Physics 99, 123510 (2006).
Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.
Lee et al., "42.2: World's Largest (15-inch) XGA AMLCD Panel Using IGZO Oxide TFT", SID 08 Digest, pp. 625-628.
Zong et al., "Structural properties of zinc nitride empty balls", Materials Letters 60 (2006), pp. 905-908.
Nomura et al., "Room-temperature fabrication of transparent flexible thin-film transistors using amorphous oxide semiconductors", Nature, vol. 432, Nov. 25, 2004, pp. 788-492.
Minami, Tadatsugu, "New n-Type Transparent Conducting Oxides", MRS Bulletin, Aug. 2000.
Zong et al., "Synthesis and thermal stability of $Zn_3N_2$ powder", Solid State Communications 132 (2004), pp. 521-525.
Kaminska et al., "Transparent p-type ZnO films obtained by oxidation of sputter-deposited $Zn_3N_2$", Solid State Communications, 135 (2005), pp. 11-15.
Son et al., "42.4L: Late-News Paper: 4 inch QVGA AMOLED Driven by the Threshold Voltage Controlled Amorphous GIZO ($Ga_2O_3$—$In_2O_3$—ZnO) TFT", SID 08 Digest, pp. 633-636.
Futushara et al., "Structural, electrical and optical properties of zinc nitride thin films prepared by reactive rf magnetron sputtering", Thin Film Solids, 322 (1998), pp. 274-281.
Carcia et al., "Transparent ZnO thin-film transistor fabricated by rf magnetron sputtering", Applied Physics Letters, col. 82, No. 7, Feb. 17, 2003, pp. 1117-1119.
Yan et al., "Control of Doping by Impurity Chemical Potentials: Predictions for p-type ZnO", Physical Review Letters, vol. 86, No. 25, Jun. 18, 2001, pp. 5723-5726.
Ohya et al., "Thin Film Transistor of ZnO Fabricated by Chemical Solution Deposition", Jpn. J. Appl. Phys., vol. 40 (2001), pp. 297-298.
Hossain, et al., "Modeling and simulation of polycrystalline ZnO thin-film transistors", Journal of Applied Physics, vol. 94, No. 12, Dec. 15, 2003, pp. 7768-7777.
Park et al., "Challenge to Future Displays: Transparent AM-OLED driven by PEALD grown ZnO TFT", IMID '07 Digest, pp. 1249-1252.
Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.
Freeman et al., "Chemical and Thin-Film Strategies for New Transparent Conducting Oxides", MRS Bulletin, Aug. 2000, p. 45-51.
Jin et al., "Optical properties of transparent and heat reflecting ZnO:Al films made by reactive sputtering", Appl. Phys. Lett. 51 (3), Jul. 20, 1987, p. 149-151.
Pei et al., "Optical and electrical properties of direct-current magnetron sputtered ZnO:Al films", Journal of Applied Physics, vol. 90, No. 7, Oct. 1, 2001, p. 3432-3436.

Gordon, "Criteria for Choosing Transparent Conductors", MRS Bulletin, Aug. 2000, p. 52-57.
European search report dated Jun. 30, 2010 for European Patent Application 08797025.7.
Barnes et al., "A comparison of plasma-activated N2/O2 and N2)/O2 mixtures for use in ZnO:N synthesis by chemical vapor deposition", Journal of Applied Physics, vol. 96, No. 12 (Dec. 2004).
Cao et al., "Low resistivity p-ZnO films fabricated by sol-gel spin coating", Applied Physics Letters, 88, 251116 (Jun. 2006).
Zhao et al., "Growth of nitrogen-doped p-type ZnO films by spray pyrolysis and their electrical and optical properties", Journal of Crystal Growth, 280 (May 2005), pp. 495-501.
Search report and written opinion for PCT/US2009/037428 mailed Sep. 29, 2009.
Barnes et al., "A comparison of plasma-activated N2/O2 and N2O/O2 mixtures for use in ZnO:N synthesis by chemical vapor deposition", Journal of Applied Physics, vol. 96, No. 12 (Dec. 2004).
Zhao et al., "Growth of nitrogen-doped p-type ZnO films by spray pyrolysis and their electrical and optical properties", Journal of Crystal Growth, 280 (May 2005), 495-501.
Ye et al., "High mobility amorphous zinc oxynitride semiconductor material for thin film transistors", Journal of Applied Physics, 106, 074512 (2009).
Chiang et al., "High mobility transparent thin-film transistors with amorphous zinc tin oxide channel layer", Appl. Phys. Lett., 86, 013503 (2005).
Fortunato et al., "Wide-bandgap high-mobility ZnO thin-film transistors produced at room temperature", Applied Physics Letters, vol. 85, No. 13, 2541-2543, (Sep. 2004).
Jackson et al., "High-performance flexible zinc tin oxide field-effect transistors", Applied Physics Letters, 87, 193503 (2005).
Zong et al., "Optical band gap of zinc nitride films prepared on quartz substrates from a zinc nitride target by reactive rf magnetron sputtering", Applied Surface Science 252 (2006), pp. 7983-7986.
Tu et al., "Nitrogen-doped p-type ZnO films prepared from nitrogen gas radio-frequency magnetron sputtering", Journal of Applied Physics 100, 053705 (2006).
Ozgur, et al. "A comprehensive review of ZnO materials and devices," Journal of Applied Physics 98, 041301 (2005), American Institute of Physics.
Wang, et al. "Epitaxial growth of NH3-doped ZnO thin films on <0224> oriented sapphire substrates," Journal of Crystal Growth 255, Apr. 9, 2003, pp. 293-297.
Ye, et al. "Preparation and characteristics of p-type ZnO films by DC reactive magnetron sputtering," Journal of Crystal Growth 253, Feb. 4, 2003, pp. 258-264.
Korean Office Action dated Jul. 21, 2008 for Korean Application No. 10-2007-0066962.
Hiramatsu, et al. "Formation of TiN films with low Cl concentration by pulsed plasma chemical vapor deposition," American Vacuum Society, vol. 14, No. 3, May/Jun. 1996, pp. 1037-1040.
Son et al., "Threshold Voltage Control of Amorphous Gallium Indium Zinc Oxide TFTs by Suppressing Back-Channel Current" Electrochemical and Solid-State Letters, 12 (1) H26-H28 (2009).
Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.
Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018- $1.00+.00, 2006, pp. 18-20.
Li et al. "Progress in semiconducting oxide-based thin-film transistors for displays," Institute of Physics, Semicon. Sci. Technol. 20 (2005), pp. 720-725.
Masuda et al. "Transparent thin film transistors using ZnO as an active channel layer and their electrical properties," Journal of Applied Physics, vol. 93, No. 3, Feb. 1, 2003, American Institute of Physics, pp. 1624-1630.
International Search Report and Written Opinion dated Aug. 8, 2008 for International Application No. PCT/US08/59638.
International Search Report and Written Opinion dated Oct. 8, 2008 for International Application No. PCT/US08/71890.

International Search Report and Written Opinion dated Oct. 15, 2007 for International Application No. PCT/US07/66166.

Futushara et al., "Optical properties of zinc oxynitride thin films", Thin Film Solids, 317 (1998), pp. 322-325.

Lu et al., "p-type conduction in N—Al co-doped ZnO thin films", Applied Physics Letters, vol. 85, No. 15, Oct. 2004, p. 3134-3135.

Zhuge et al., "ZnO p-n homojunctions and ohmic contacts to Al—N-co-doped p-type ZnO", Applied Physics Letters, vol. 87, Aug. 2005.

dit Picard et al., "Detection of NH3 and H2S with thick film semiconductor sensors based on $Cd_{2-x}GeO_{4-x-3y}N_{2y}$ oxynitrides", Sensors and Actuators B, vol. 42, 1997, pp. 47-51.

Office Action for Chinese Patent Application No. 200880106291.5 dated Mar. 30, 2011.

International Search Report and Written Opinion for PCT/US2010/049239 dated May 4, 2011.

* cited by examiner

PROCESS TO MAKE METAL OXIDE THIN FILM TRANSISTOR ARRAY WITH ETCH STOPPING LAYER

CROSS-REFERENCE TO RELATED APPLICATIONS

This application claims benefit of U.S. provisional patent application Ser. No. 61/038,289, filed Mar. 20, 2008, which is herein incorporated by reference.

BACKGROUND OF THE INVENTION

1. Field of the Invention

Embodiments of the present invention generally relate to a thin film transistor (TFT) fabrication method and a TFT produced by the method.

2. Description of the Related Art

Current interest in TFT arrays is particularly high because these devices may be used in liquid crystal active matrix displays (LCDs) of the kind often employed for computer and television flat panels. The LCDs may also contain light emitting diodes (LEDs) for back lighting. Further, organic light emitting diodes (OLEDs) have been used for active matrix displays, and these OLEDs utilize TFTs for addressing the activity of the displays.

TFTs made with amorphous silicon as the active material have become the key components of the flat panel display industry. There are two general types of TFTs in industry. The first type is called a top gate TFT because the gate electrode is located above the source and drain electrodes. The second type is called a bottom gate TFT because the gate electrode is located below the source and drain electrodes. In the bottom gate TFT structure, the source and drain electrodes are disposed over the active material layer.

The source and drain electrodes in a bottom gate TFT may be fabricated by depositing a metal layer over the active material layer and then etching the metal layer to define the source and drain electrodes. During the etching, the active material layer may be exposed to the plasma. Plasma exposure of the active material layer may negatively affect the performance of the TFT. To prevent plasma exposure of the active material layer, an etch stop may be used. Thus, the etch stop bottom gate TFTs generally have better performance than non-etch stop bottom gate TFTs.

An etch stop bottom gate TFT has an etch stop layer deposited between the active material layer and the metal layer used for the source and drain electrodes. The etch stop layer is blanket deposited and then etched using a mask such that the remaining portion of the etch stop is disposed over the gate electrode. Thereafter, the metal layer is blanket deposited followed by etching the active material layer and the metal layer with a mask. Then, the source and drain electrodes are defined by etching through the metal layer using a mask. Thus, the etch stop bottom gate TFT utilizes at least three masks for the patterning (i.e., to pattern the etch stop, to pattern the active material layer and metal layer, and to define the source and drain electrodes). The bottom gate TFTs without etch stops, by contrast, necessitate at least one less mask which therefore has made the bottom gate TFTs without etch stops the preferred TFT despite the better performance of the etch stop bottom gate TFTs.

Therefore, there is a need in the art for an etch stop bottom gate TFT fabrication method that utilizes fewer masks.

SUMMARY OF THE INVENTION

The present invention generally relates to TFTs and methods of making TFTs. The active channel of the TFT may comprise one or more metals selected from the group consisting of zinc, gallium, tin, indium, and cadmium. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet or dry etching the active material layer that is used for the active channel.

In one embodiment, a thin film transistor formation method comprises depositing and patterning a gate electrode over a substrate, depositing a gate dielectric layer over the gate electrode, and depositing a semiconductive active layer over the gate dielectric layer. The active layer may comprise oxygen, nitrogen, and one or more elements selected from the group consisting of zinc, indium, cadmium, gallium, and tin. The active layer may be doped. The method also comprises depositing an etch stop layer over the active layer, forming a first mask over the etch stop layer, patterning the etch stop layer and removing the first mask. The method also comprises depositing a metal layer over the etch stop layer, forming a second mask over the metal layer, etching the metal layer to define a source electrode and a drain electrode and removing the second mask. The method also comprises etching the active layer and depositing a passivation layer over the source electrode and the drain electrode.

In another embodiment, a method comprises depositing a semiconductor layer over a substrate. The semiconductor layer may comprise oxygen, nitrogen, and one or more elements selected from the group consisting of zinc, gallium, indium, cadmium, and tin. The semiconductor layer may comprise a dopant. The method also comprises depositing an etch stop layer over the semiconductor layer, forming a first mask over the etch stop layer, patterning the etch stop layer and removing the first mask. The method also comprises depositing a metal layer over the etch stop layer and the semiconductor layer, forming a second mask over the metal layer, etching the metal layer and removing the second mask. The method also comprises etching at least a portion of the semiconductor layer while using the metal layer and the etch stop layer as masks.

In another embodiment, a thin film transistor comprises a gate electrode disposed over a substrate, a gate dielectric layer disposed over the gate electrode, and a semiconductor layer disposed over the gate dielectric layer. The semiconductor layer may comprise oxygen, nitrogen, and one or more elements selected from the group consisting of zinc, gallium, indium, cadmium, and tin. The semiconductor layer may be doped. A source electrode, a drain electrode, and an etch stop layer may be disposed over the semiconductor layer and between the source electrode and the drain electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to TFTs and methods of making TFTs. The active channel of the TFT may comprise one or more metals selected from the group consisting of zinc, gallium, tin, indium, and cadmium. The active channel may or may not be doped. The active channel may also comprise nitrogen and oxygen. To protect the active channel during source-drain electrode patterning, an etch stop layer may be deposited over the active layer. The etch stop layer prevents the active channel from being exposed to the plasma used to define the source and drain electrodes. The etch stop layer and the source and drain electrodes may be used as a mask when wet etching the active material layer that is used for the active channel.

Figure 1A:
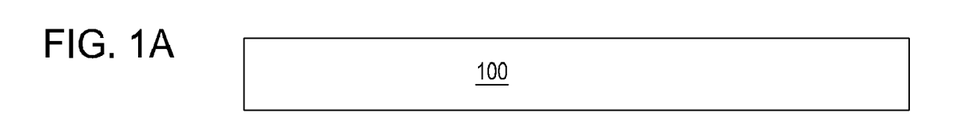
FIGS. 1A-1J show a TFT in various stages of processing according to one embodiment of the invention.

FIGS. 1A-1J show a TFT in various stages of processing according to one embodiment of the invention. In FIG. 1A, a substrate 100 is shown. In one embodiment, the substrate 100 may comprise glass. In another embodiment, the substrate 100 may comprise a polymer. In another embodiment, the substrate 100 may comprise plastic. In another embodiment, the substrate 100 may comprise metal.

Figure 1B:
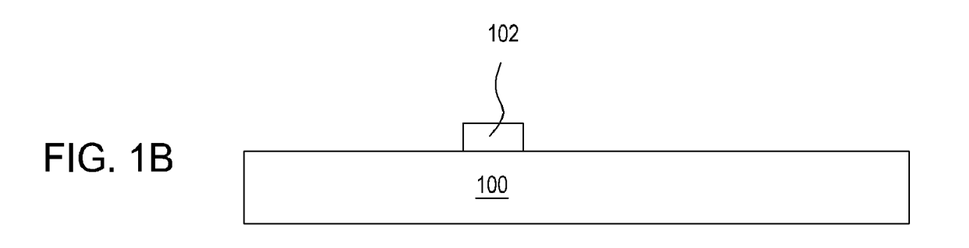

Over the substrate 100, a gate electrode layer may be deposited. The gate electrode layer may be patterned to form the gate electrode 102 as shown in FIG. 1B. The gate electrode 102 may comprise an electrically conductive layer that controls the movement of charge carriers within the TFT. The gate electrode 102 may comprise a metal such as chromium, molybdenum, aluminum, tungsten tantalum, copper, or combinations thereof. The gate electrode 102 may be formed using conventional techniques including sputtering, lithography, and etching.

Figure 1C:
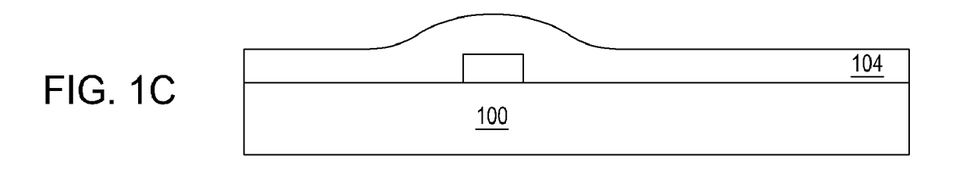

A gate dielectric layer 106 may be deposited over the gate electrode 102 as shown in FIG. 1C. The gate dielectric layer 106 may comprise silicon dioxide, silicon oxynitride, silicon nitride, or combinations thereof. The gate dielectric layer 106 may be deposited by well known deposition techniques including plasma enhanced chemical vapor deposition (PECVD).

Figure 1D:
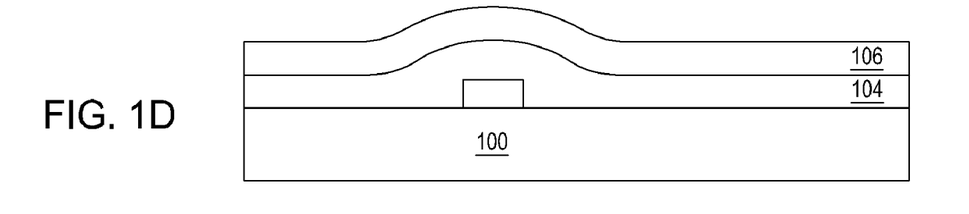

Over the gate dielectric layer 106, the active layer 106 may be formed as shown in FIG. 1D. In one embodiment, the active layer 106 is annealed. In another embodiment, the active layer 106 is exposed to a plasma treatment. The annealing and/or plasma treatment may increase the mobility of the active layer 106. The active layer 106 may comprise the compound having one or more elements selected from the group consisting of zinc, tin, gallium, cadmium, and indium. In one embodiment, the element may comprise an element having a filled d orbital. In another embodiment, the element may comprise an element having a filled f orbital. The active layer 106 may also comprise oxygen and nitrogen. In one embodiment, the compound may be doped. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant comprises aluminum. In one embodiment, the active layer 106 may comprise oxygen and one or more elements selected from the group consisting of zinc, tin, gallium, cadmium, and indium.

The active layer 106 may be deposited by reactive sputtering. The reactive sputtering method may be practiced in a physical vapor deposition (PVD) chamber for processing large area substrates, such as a 4300 PVD chamber, available from AKT America, Inc., a subsidiary of Applied Materials, Inc., Santa Clara, Calif. However, because the active layer produced according to the method may be determined by the structure and composition, it should be understood that the reactive sputtering method may have utility in other system configurations, including those systems configured to process large area round substrates and those systems produced by other manufacturers, including roll-to-roll process platforms. It is to be understood that other methods including chemical vapor deposition (CVD), atomic layer deposition (ALD), or spin-on processes may be utilized to deposit the active layer 106.

For PVD, a sputtering target may contain one or more of zinc, indium, tin, gallium, and cadmium. One or more dopants may also be present. The sputtering may comprise full reactive sputtering. Full reactive sputtering comprises sputtering a target that does not contain the reactive material in an atmosphere containing the reactive material. Full reactive sputtering is distinct from RF reactive sputtering where a target contains not only the metal, but also the reactant. In RF reactive sputtering, the material is sputtered and then further reacted with additional reactant provided in the reactive gas.

For the present invention, the sputtering target for full reactive sputtering may comprise one or more of zinc, indium, tin, gallium, and cadmium, and a dopant may or may not be present. No oxygen or nitrogen is present in the target. The sputtering target may be DC biased while an inert gas, a nitrogen containing gas, and an oxygen containing gas are introduced into the sputtering chamber. The nitrogen of the nitrogen containing gas and the oxygen of the oxygen containing gas then react with the one or more of zinc, indium, tin, gallium, and cadmium to deposit the layer on the substrate. In one embodiment, the inert gas may comprise argon. In one embodiment, the nitrogen containing gas may be selected from the group of nitrogen, nitrogen oxide, and combinations thereof. In one embodiment, the oxygen containing gas may be selected from the group of oxygen, ozone, nitrogen oxide, and combinations thereof. The active layer 106 may be crystalline or semicrystalline. The active layer 106 may not be amorphous.

Figure 1E:
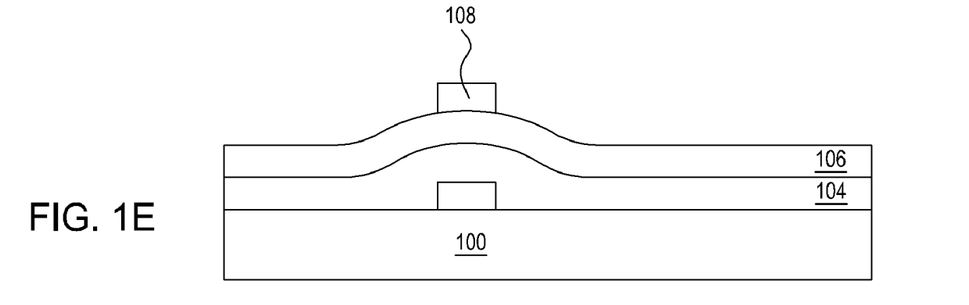

Once the active layer 106 has been deposited, an etch stop layer may be deposited and etched using a mask to have an etch stop 108 disposed on the active layer 106 over the gate electrode 102 as shown in FIG. 1E. The etch stop 108 may be formed by blanket depositing, followed by photoresist depositing, followed by pattern developing. The etch stop 108 may be patterned by plasma etching using one or more gases selected from the group consisting of fluorine containing etchants such as $CF_4$, $C_2F_6$, $CHF_3$, $C_4F_6$, oxygen, nitrogen, inert gases such as argon, or combinations thereof. In one embodiment, the etch stop layer 108 may comprise silicon nitride. In another embodiment, the etch stop layer 108 may comprise silicon oxynitride. In still another embodiment, the etch stop layer 108 may comprise silicon oxide. The etch stop layer may be deposited by well known deposition techniques including PECVD and spin-on coating. In one embodiment, the etch stop 108 may be pattern deposited utilizing a mask. After the etch stop 108 is formed, the photoresist mask may be removed.

Figure 1F:
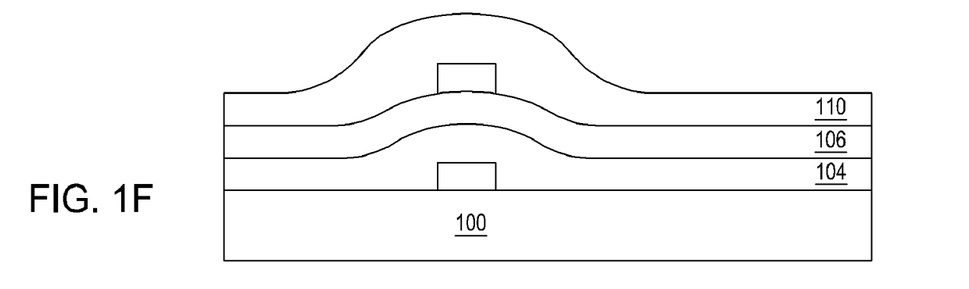
Figure 1G:
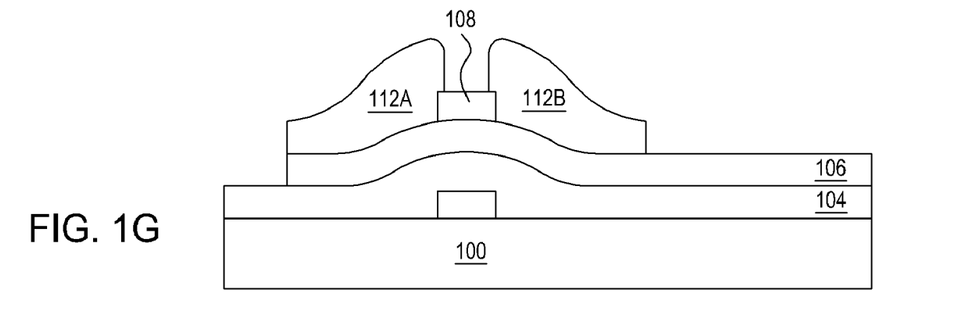

Following fabrication of the etch stop 108, a metal layer 110 may be deposited thereover as shown in FIG. 1F. In one embodiment, the metal layer may comprise a metal such as aluminum, tungsten, molybdenum, chromium, tantalum, and combinations thereof. The metal layer 110 may then be patterned to define the source and drain electrodes 112A, 112B as shown in FIG. 1G. The metal layer 110 may be patterned by depositing a photolithographic or photoresist mask thereon and etching utilizing the mask. The metal layer 110 may be etched utilizing a plasma etch. In one embodiment, the plasma etching may comprise exposing the metal layer 110 to a plasma containing a gas having an element selected from the group consisting of chlorine, oxygen, fluorine, or combinations thereof. During the etching, the active layer 106 that is not covered by the etch stop 108 may be exposed to the plasma, but the active layer 106 over the gate electrode 102 may not be exposed to the plasma due to the presence of the etch stop 108. The active layer 106 exposed to the plasma may etch at a slower rate than the metal layer 110 when exposed to the plasma. In one embodiment, the active layer 106 may not etch at all when exposed to the plasma. After the source and drain electrodes 112A, 112B have been defined, the photoresist mask may be removed.

Figure 1H:
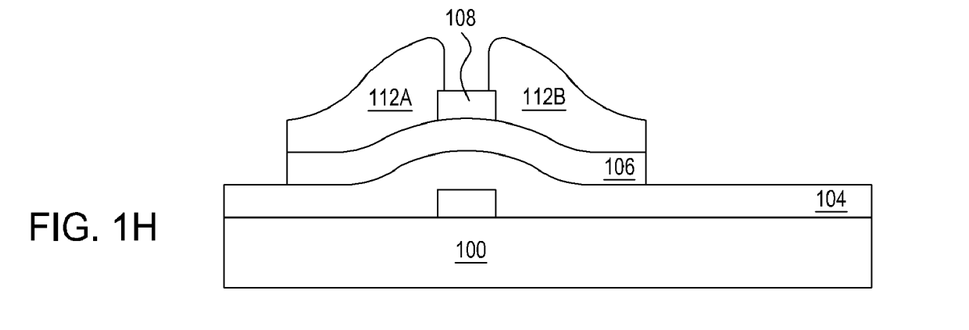

After the plasma etching, the etch stop 108 and the source and drain electrodes 112A, 112B may be used as a mask during wet etching of the active layer 106 as shown in FIG. 1H. The etch stop 108 and the source and drain electrodes 112A, 112B etch at a slower rate than the active layer 106 when exposed to the wet etchant. In one embodiment, the etch stop 108 and the source and drain electrodes 112A, 112B may not etch at all when exposed to the wet etchant. Hence, no additional mask layer needs to be deposited and patterned to perform the etching. The source and drain electrodes 112A, 112B as well as the etch stop 108 function as a mask when etching the exposed active layer 106. Thus, no additional mask is deposited or removed and fewer masks are used than in previous methods. The wet etchant may comprise any conventional wet etchant that may etch the effective for etching the active layer 106 without etching the etch stop 108 and the source and drain electrodes 112A, 112B. The etchant may comprise an acid with a pH of less than 3 of a base with a pH higher than 10. In one embodiment, the etchant may comprise diluted HCl. In another embodiment, the etchant may comprise the same liquid as used for developing the photoresist.

Figure 1I:
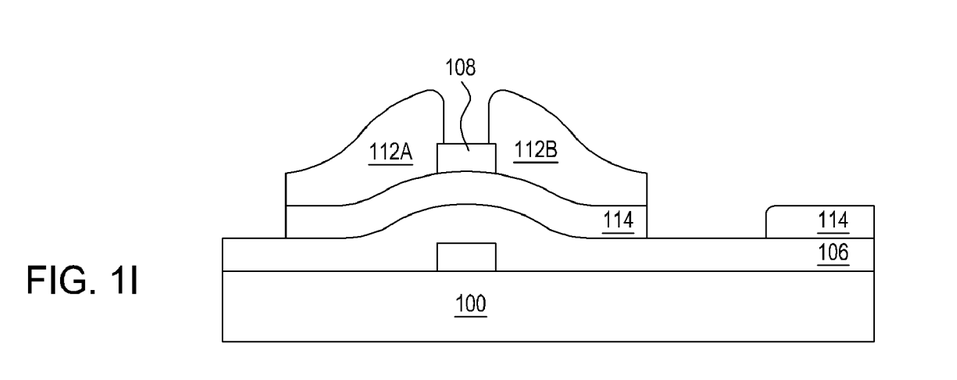
Figure 1J:
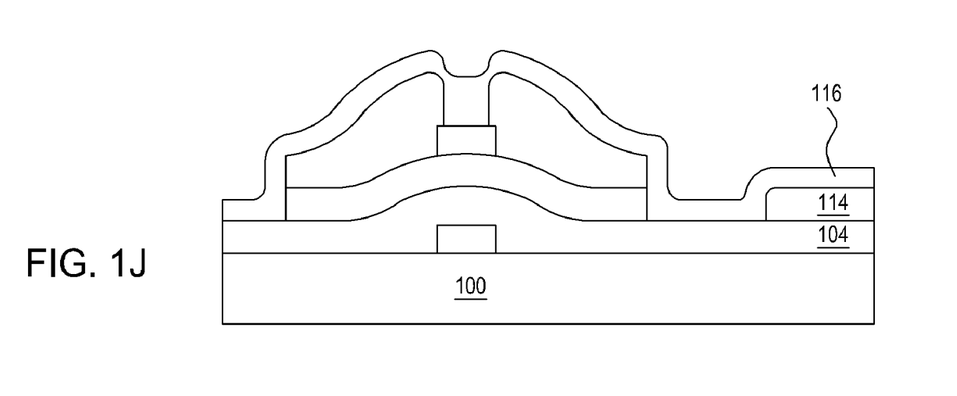

A display electrode 114 may then be deposited over the gate dielectric layer 104 as shown in FIG. 1I. The display electrode 114 may comprise a metal such as aluminum, tungsten, molybdenum, chromium, tantalum, and combinations thereof. A passivation layer 116 may then be deposited over the structure as shown in FIG. 1J. The passivation layer 116 may be deposited to a thickness between about 1000 Angstroms to about 5000 Angstroms. In one embodiment, the passivation layer 116 may comprise silicon dioxide or silicon nitride.

Figure 2:
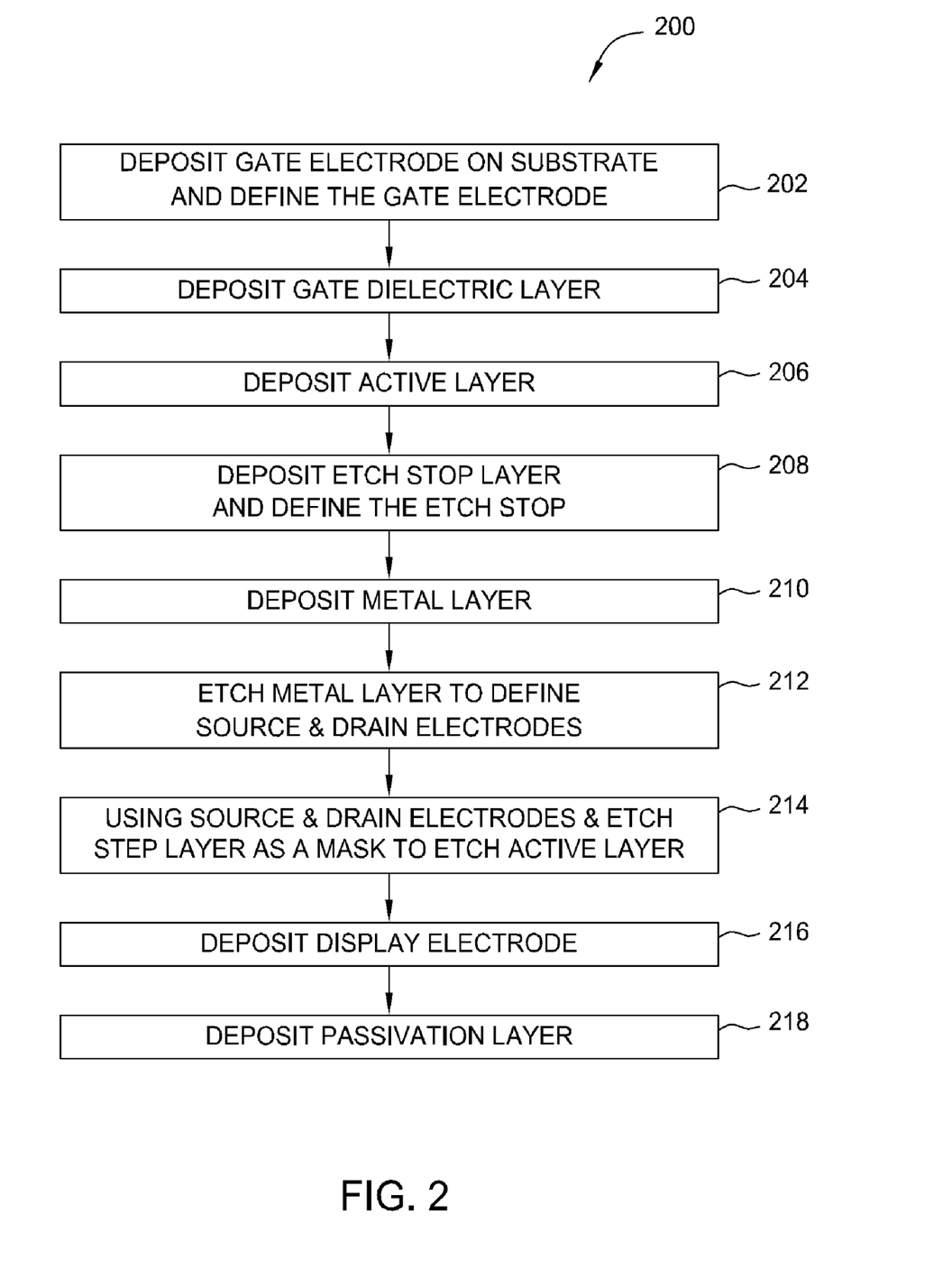
FIG. 2 is a flow chart 200 of a TFT fabrication process according to one embodiment of the invention.

FIG. 2 is a flow chart 200 of a TFT fabrication process according to one embodiment of the invention. In step 202, the gate electrode is deposited onto the substrate. The gate electrode may be deposited as a layer and then etched utilizing a photoresist mask as the pattern. In one embodiment, the gate electrode may be pattern deposited onto the substrate. In step 204, a gate dielectric layer may be blanket deposited over the substrate and gate electrode. An active layer may then be deposited over the gate dielectric layer in step 206. An etch stop layer may then be deposited in step 208. Following the deposition of the etch stop layer, the etch stop layer may be patterned to define an etch stop portion over the active layer above the gate electrode. The patterning may comprise depositing a photoresist layer thereover, patterning the photoresist layer to create a mask, and etching to remove undesired portions of the etch stop layer. The mask is then removed.

A metal layer may then be deposited in step 210. The metal layer will eventually become the source and drain electrodes. In step 212, the source and drain electrodes may be defined by depositing a second mask, etching the metal layer and then removing the second mask. In step 214, the active layer may then be etched by using the source and drain electrodes as well as the etch stop layer as a mask without depositing and removing another mask. A display electrode may then be deposited in step 216 over the gate dielectric layer that was exposed when the active layer was etched. A passivation layer may then be deposited over the entire structure in step 218.

Figure 3A:
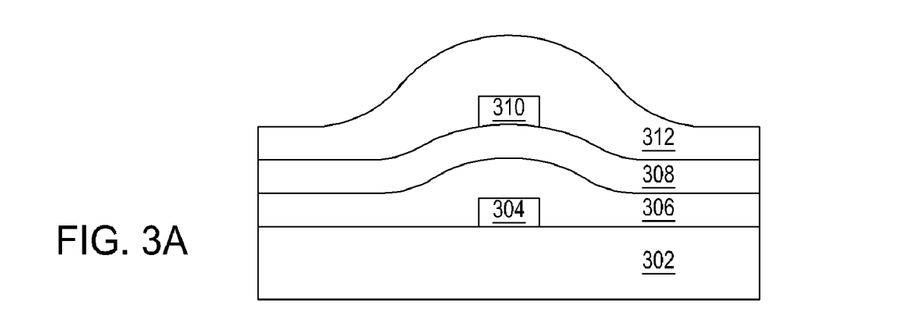
FIGS. 3A-3D show a TFT in various stages of processing according to another embodiment of the invention.

FIGS. 3A-3D show a TFT in various stages of processing according to another embodiment of the invention. FIG. 3A shows a structure comprising a substrate 302, a gate electrode 304, a gate dielectric layer 306, an active layer 308, an etch stop 310, and a metal layer 312. The structure shown in FIG. 3A may be formed in a manner similar to that discussed above in regards to FIGS. 1A-1F.

Figure 3B:
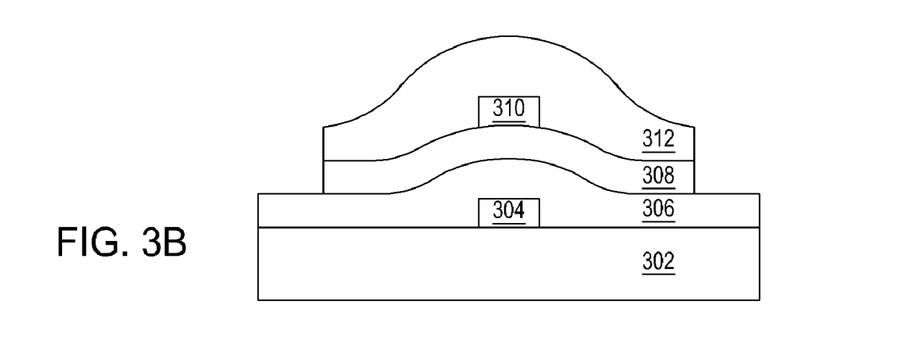
Figure 3C:
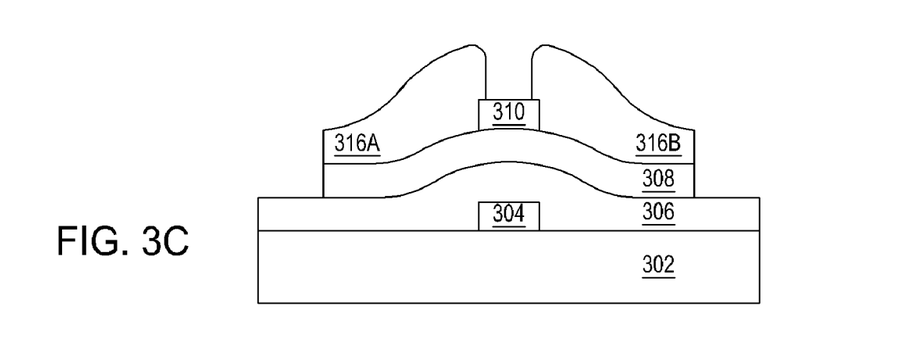

After the metal layer 312 is deposited, the metal layer 312 and the active layer 308 may be etched to expose a portion of the gate dielectric layer 306 as shown in FIG. 3B. The etching may comprise depositing a photoresist mask over the metal layer 312 and etching utilizing the mask. The area above the etch stop 310 and the gate electrode 304 may not be etched. The source and drain electrodes 316A, 316B may then be defined by etching. A photoresist layer may be deposited over the exposed gate dielectric layer 306 and the metal layer 312. The photoresist layer may then be pattered to produce a mask. The source and drain electrodes 316A, 316B may then be defined by etching using the photoresist mask as shown in FIG. 3C. The photoresist mask may then be removed. The display electrode has not been shown for clarity, but it is to be understood that the display electrode may be deposited before the passivation layer 314 is deposited.

Figure 3D:
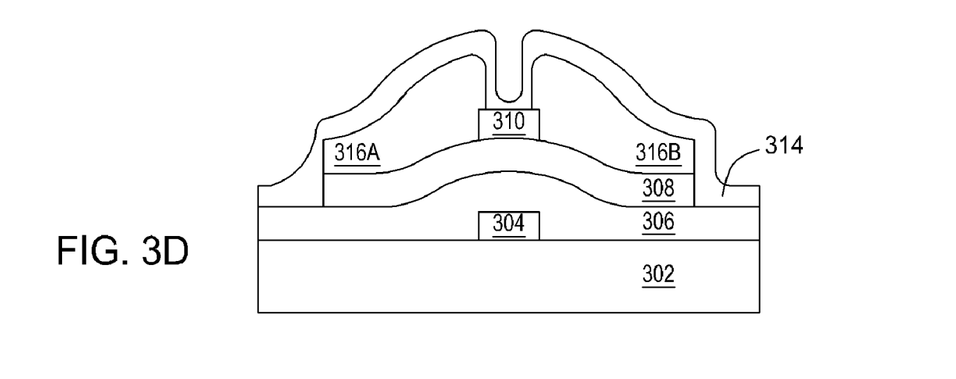

A passivation layer 314 may then be deposited over the source and drain electrodes 316A, 316B, the etch stop 310, and the exposed gate dielectric 306 as shown in FIG. 3D. The etch stop 310 may function as a passivation layer for the active channel. Thus, it may not be necessary to have a passivation layer directly on the etch stop 310.

Figure 4:
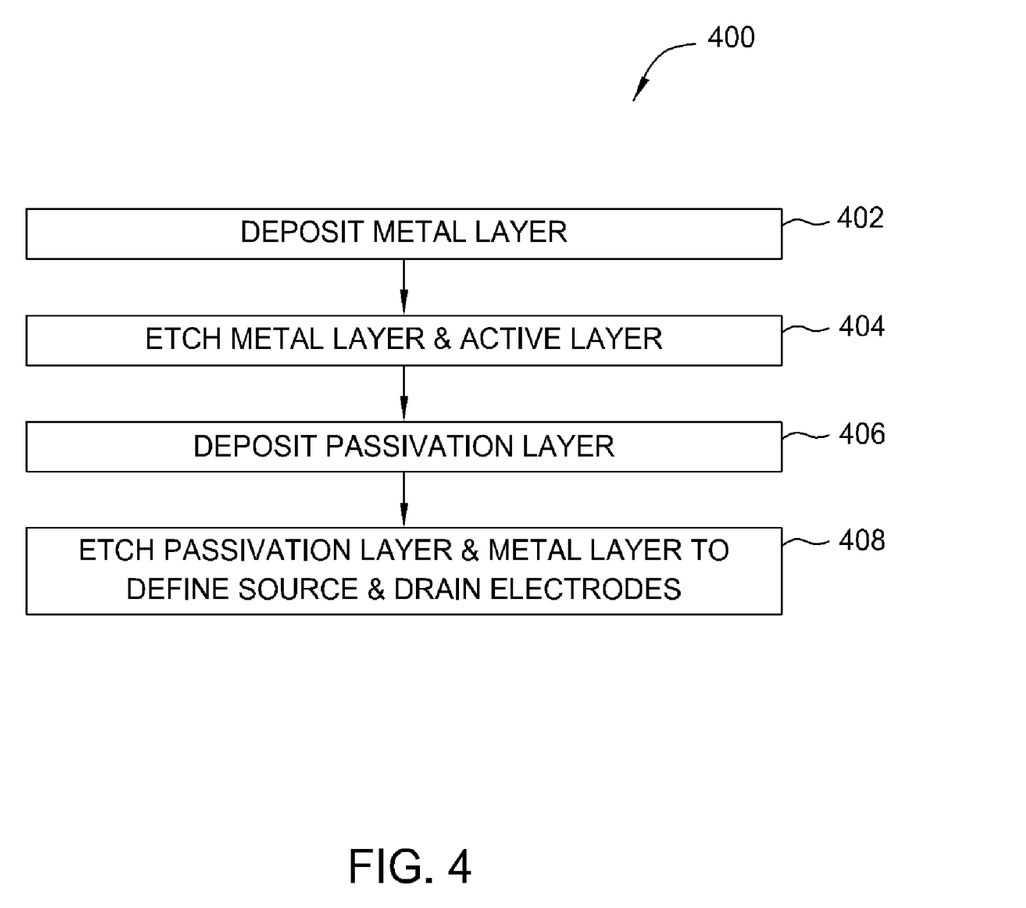
FIG. 4 is a flow chart 400 of a TFT fabrication process according to another embodiment of the invention.

FIG. 4 is a flow chart 400 of a TFT fabrication process according to another embodiment of the invention. In step 402, a metal layer may be deposited over an etch stop and an active layer that has been previously deposited. The etch stop and the active layer may be disposed over a gate dielectric layer, a gate electrode, and a substrate.

In step 404, the metal layer and the active layer may be etched without etching the active channel. In so doing, the gate dielectric layer may be exposed. A passivation layer may then be deposited over the exposed gate dielectric layer as well as the metal layer in step 406. The passivation layer may then be etched in step 408. In etching the passivation layer, the source and drain electrodes may be defined by etching the metal layer to expose the etch stop that is disposed over the active layer in an area corresponding to the gate electrode.

In between the gate dielectric layer deposition, the active layer deposition, and the etch stop deposition, the substrate may be maintained under vacuum. By maintaining the substrate in a vacuum state between the depositions, the various layers of the TFT are not exposed to the atmosphere where undesirable contaminants in the air may contaminate the TFT. Thus, the TFT maintained in a vacuum state during and between the depositions may have good quality and be produced at a low cost. In between the depositions, the TFT may be exposed to surface treatment processes as desired. Additionally, after the active layer deposition and/or after the etch stop layer deposition, the TFT may be annealed.

By utilizing the source and drain electrodes as well as an etch stop as a mask, the active layer may be etched without depositing and removing an additional mask. Without the additional mask, several processing steps of prior art methods may be obsolete. By utilizing fewer masks, substrate throughput may be increased.

While the foregoing is directed to embodiments of the present invention, other and further embodiments of the invention may be devised without departing from the basic scope thereof, and the scope thereof is determined by the claims that follow.

The invention claimed is:

1. A thin film transistor formation method, comprising:
depositing and patterning a gate electrode over a substrate;
depositing a gate dielectric layer over the gate electrode;
depositing a semiconductive active layer over the gate dielectric layer, the semiconductive active layer comprising oxygen, nitrogen, and one or more elements selected from the group consisting of zinc, indium, cadmium, gallium, and tin;
depositing an etch stop layer over the active layer;
forming a first mask over the etch stop layer;
etching the etch stop layer to form a patterned etch stop layer;
removing the first mask to expose the patterned etch stop layer;
depositing a metal layer over the patterned etch stop layer;
forming a second mask over the metal layer;
etching the metal layer to define a source electrode and a drain electrode;
removing the second mask;
etching the active layer using the source electrode and the drain electrode as a mask; and
depositing a passivation layer over the source electrode and the drain electrode.

2. The method of claim 1, wherein etching the metal layer comprises plasma etching and wherein etching the active layer comprises wet etching.

3. The method of claim 2, wherein etching the active layer comprises utilizing the source electrode, the drain electrode and the patterned etch stop layer collectively as a mask without depositing and removing an additional mask.

4. The method of claim 1, wherein the etch stop layer is selected from the group consisting of silicon nitride, silicon oxide and combinations thereof.

5. The method of claim 1, wherein the etch stop layer is deposited by plasma enhanced chemical vapor deposition.

6. The method of claim 5, wherein the active layer is deposited by applying a DC electrical bias to a metallic sputtering target comprising the one or more elements selected from the group consisting of zinc, indium, cadmium, gallium, and tin, and introducing an oxygen containing gas and a nitrogen containing gas.

7. The method of claim 6, wherein the oxygen containing gas and the nitrogen containing gas are separate gases.

8. The method of claim 7, wherein the sputtering target comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof.

9. The method of claim 1, wherein the active layer comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof.

10. A method, comprising:
depositing a semiconductor layer over a substrate, the semiconductor layer comprising oxygen, nitrogen, and one or more elements selected from the group consisting of zinc, gallium, indium, cadmium, and tin;
depositing an etch stop layer over the semiconductor layer;
forming a first mask over the etch stop layer;
patterning the etch stop layer to form a patterned etch stop layer;
removing the first mask;
depositing a metal layer over the patterned etch stop layer and the semiconductor layer;
forming a second mask over the metal layer;
etching the metal layer to form a patterned metal layer;
removing the second mask; and
etching at least a portion of the semiconductor layer while using the patterned metal layer and the patterned etch stop layer as masks.

11. The method of claim 10, wherein the etching the metal layer comprises plasma etching and wherein the etching the semiconductor layer comprises wet etching.

12. The method of claim 10, wherein the etch stop layer is selected from the group consisting of silicon nitride, silicon oxide and combinations thereof.

13. The method of claim 10, wherein the etch stop layer is deposited by plasma enhanced chemical vapor deposition.

14. The method of claim 10, wherein the semiconductor layer is deposited by applying a DC electrical bias to a sputtering target comprising the one or more elements selected from the group consisting of zinc, indium, cadmium, gallium, and tin, and introducing an oxygen containing gas and a nitrogen containing gas.

15. The method of claim 14, wherein the oxygen containing gas and the nitrogen containing gas are separate gases.

16. The method of claim 15, wherein the sputtering target comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof.

17. The method of claim 10, wherein the semiconductor layer comprises a dopant selected from the group consisting of Al, Sn, Ga, Ca, Si, Ti, Cu, Ge, In, Ni, Mn, Cr, V, Mg, $Si_xN_y$, $Al_xO_y$, SiC, and combinations thereof.

* * * * *

UNITED STATES PATENT AND TRADEMARK OFFICE
CERTIFICATE OF CORRECTION

PATENT NO. : 8,143,093 B2  
APPLICATION NO. : 12/405897  
DATED : March 27, 2012  
INVENTOR(S) : Ye

Page 1 of 1

It is certified that error appears in the above-identified patent and that said Letters Patent is hereby corrected as shown below:

In Detailed Description:

Column 5, Line 46, please delete "FIG. 11" and insert --FIG 1I-- therefor.

Signed and Sealed this  
Third Day of July, 2012

David J. Kappos  
*Director of the United States Patent and Trademark Office*